(12) United States Patent
Abuellil et al.

(10) Patent No.: US 10,763,785 B2
(45) Date of Patent: Sep. 1, 2020

(54) FAST STARTUP TIME FOR CRYSTAL OSCILLATOR

(71) Applicant: Shenzhen Goodix Technology Co., Ltd., Shenzhen (CN)

(72) Inventors: Amr Abuellil, San Diego, CA (US); Janakan Sivasubramaniam, San Diego, CA (US)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 0 days.

(21) Appl. No.: 16/556,249

(22) Filed: Aug. 30, 2019

(65) Prior Publication Data

US 2020/0007083 A1 Jan. 2, 2020

Related U.S. Application Data

(63) Continuation of application No. 15/853,942, filed on Dec. 25, 2017, now Pat. No. 10,432,143.

(51) Int. Cl.
*H03L 3/00* (2006.01)
*H03B 5/06* (2006.01)
(Continued)

(52) U.S. Cl.
CPC .............. *H03B 5/36* (2013.01); *H03B 5/06* (2013.01); *H03B 5/364* (2013.01); *H03B 29/00* (2013.01);
(Continued)

(58) Field of Classification Search
CPC ... H03B 5/06; H03B 5/30; H03B 5/32; H03B 5/36; H03B 5/362; H03B 5/364; H03B 2200/0094; H03L 3/00
(Continued)

(56) References Cited

U.S. PATENT DOCUMENTS 9,000,852 B1 4/2015 Sinitsky et al.
2004/0046616 A1* 3/2004 Prentice ............... H03B 5/1243
331/111
(Continued)

FOREIGN PATENT DOCUMENTS

KR 20110114961 A 10/2011

OTHER PUBLICATIONS

European Search Report dated Nov. 25, 2019 in the corresponding EP application (application No. 18765790.3).
(Continued)

*Primary Examiner* — Levi Gannon
(74) *Attorney, Agent, or Firm* — Kilpatrick Townsend & Stockton LLP

(57) ABSTRACT

Embodiments can provide individualized controlling of noise injection during startup of a crystal oscillator. In some embodiments, a simple learning block can be placed in parallel to a crystal oscillator circuit to control noise injection during the startup of the crystal oscillator. The learning block can be configured to control the noise injection during the startup of the crystal oscillator by determining whether the crystal oscillator has been stabilized. In some implementations, an adjustment block may be employed to adjust the count determined by the learning block based on one or more characteristics of the crystal oscillator during a startup of the crystal oscillator. In some embodiments, a simple block that creates a negative capacitance can be configured in parallel to the crystal oscillator.

20 Claims, 6 Drawing Sheets

(51) Int. Cl.
*H03B 5/36* (2006.01)
*H03B 29/00* (2006.01)
(52) U.S. Cl.
CPC ........ H03L 3/00 (2013.01); *H03B 2200/0074* (2013.01); *H03B 2200/0094* (2013.01)
(58) Field of Classification Search
USPC .......................................... 331/154, 158, 173
See application file for complete search history.

(56) References Cited

U.S. PATENT DOCUMENTS

| | | | |
|---|---|---|---|
| 2004/0169562 A1* | 9/2004 | Novac | H03B 5/06 331/158 |
| 2005/0151596 A1* | 7/2005 | Lin | H03B 5/06 331/158 |
| 2011/0037527 A1 | 2/2011 | Shrivastava et al. | |

OTHER PUBLICATIONS

Esmaeelzadeh Han! et al: "precisely-timed energy injection technique achieving 58/10/2[mu]s start-up in 1.84/10/50MHz crystal oscillators", 2017 IEEE Custom Integrated Circuits Conference (CICC), IEEE, Apr. 30, 2017 (Apr. 30, 2017), pp. 1-4, XP033130538.

* cited by examiner

FAST STARTUP TIME FOR CRYSTAL OSCILLATOR

CROSS-REFERENCE APPLICATION

This application is a continuation of U.S. patent application Ser. No. 15/853,942, filed on Dec. 25, 2017, entitled "CIRCUIT AND METHOD FOR FACILITATING STARTUP TIME OF CRYSTAL OSCILLATOR," the disclosure of which is hereby incorporated by reference in its entirety for all purposes.

TECHNICAL FIELD

The embodiments herein generally relate to facilitating a startup of a crystal oscillator in a circuit.

BACKGROUND

Various types of oscillators are commonly used to provide a reference signal for use within electronic circuits. Their piezoelectric properties allow them to be a frequency-determining element in electronic circuits. A crystal oscillator, particularly one made of quartz crystal, works by being distorted by an electric field when voltage is applied to an electrode near or on the crystal. This property is known as electrostriction or inverse piezoelectricity. When the field is removed, the quartz—which oscillates in a precise frequency—generates an electric field as it returns to its previous shape, and this can generate a voltage.

Typically, a crystal oscillation circuit includes a crystal oscillator, an inverter coupled in parallel with the crystal oscillator, and capacitors coupled to the input and output of the inverter and to ground. To conserve power, the crystal oscillation circuit includes an enable/disable mechanism. The crystal oscillator can be started by injecting energy composed of noise and/or transient power supply response. The startup time of a crystal oscillator is typically determined by the noise or transient conditions at turn-on; small-signal envelope expansion due to negative resistance; and large-signal amplitude limiting.

It is known that crystal resistance is not constant, typically being higher at start-up than when oscillating in steady state. The crystal resistance is related to the Q factor of the oscillator, which dictates the amount of power applied to the crystal to keep it oscillating at the same amplitude. As the resistance decreases, the amount of power consumed decreases. The variation in the crystal resistance causes more power to be used at start-up than is desired to achieve the best noise performance in steady state operation. However, decreasing the power such that optimal noise performance is achieved in steady state increases the amount of time for the crystal A common approach to startup the crystal oscillator is to inject high energy at the beginning, and then making the expansion even faster to reach the desired frequency. With this approach, a lot of energy is used to startup the crystal oscillator. Under this approach, the startup time for the crystal oscillator can be between 500-600 us for crystals that oscillate around 26 MHz. However, this approach does not work well in the context when power supply is limited.

Another common approach is to inject noise at the startup time into the oscillation of the crystal element. In general, certain amount of phase noise is preferred during the oscillation of the crystal element. Various techniques have been proposed to inject noises at the startup time of the crystal element.

SUMMARY

Embodiments can provide individualized controlling of noise injection during startup of a crystal oscillator. Since individual crystal elements are different in terms of their physical characteristics such as capacitance, aging, etc., startup time for different crystal oscillators can be different. In some embodiments, a simple learning block can be placed in parallel to a crystal oscillator circuit to control noise injection during the startup of the crystal oscillator. The learning block can be configured to control the noise injection during the startup of the crystal oscillator by determining whether the crystal oscillator has been stabilized.

In some implementations, the learning block can comprise a counter, a buffer, a determinator, and/or any other component. The determinator can be configured to determine whether the crystal oscillator has reached the desired frequency (stabilize) for a given startup cycle. The counter can be configured to count the number of clock cycles taken for the crystal oscillator to reach the desired frequency and the buffer can be used to store a count indicating a counted number of clock cycles, which can be read by a disable mechanism for deactivating noise injection.

In some implementations, an adjustment block may be employed to adjust the count determined by the learning block based on one or more characteristics of the crystal oscillator during a startup of the crystal oscillator. The adjustment block can comprise an adjustment determinator, an adjuster, and/or any other components. The adjustment determinator can be configured to determine an adjustment for the clock cycles to stabilize the crystal element 102. The adjuster can be configured to adjust the count based on the adjustment determined by the adjustment determinator.

In some embodiments, a simple block that creates a negative capacitance (Cneg) can be configured in parallel to the crystal oscillator. The Cneg may be a float negative resistance and can be used to cancel the shunt resistance of the crystal oscillator. In those embodiments, the Cneg circuit may be only used during the startup time for the crystal oscillator such that the Cneg circuit is disconnect once the crystal oscillator stabilizes to avoid frequency shifting. In some implementations, the Cneg circuit can be configured to generate negative impedance comprising a combination of negative resistance and capacitance to cancel the impedance of the crystal element.

Other objects and advantages of the invention will be apparent to those skilled in the art based on the following drawings and detailed description.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Figure 1:
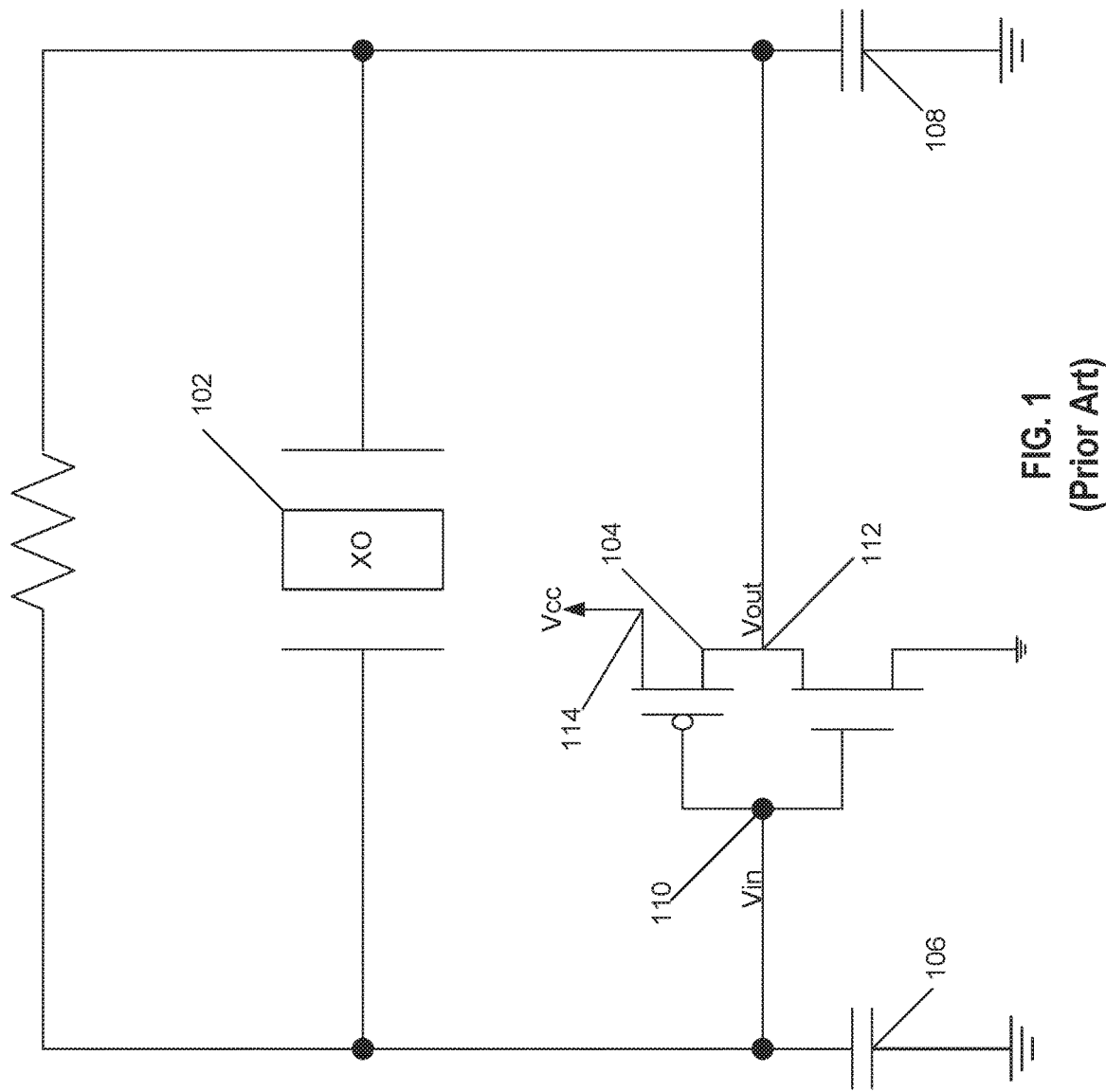
FIG. 1 illustrates an example oscillator circuit in accordance with the disclosure.

A crystal oscillator is typically formed in an oscillator circuit 100 such as the one illustrated in FIG. 1. As shown, the oscillator circuit 100 can comprise a crystal element 102, a CMOS inverter 104, a stabilizing capacitor 106, another stabilizing capacitor 108, a transistor 114 and/or any other components. In this example, the crystal element 102 is connected in parallel to the high gain CMOS inverter 104. Stabilizing capacitors 106 and 108 are connected to ground and respectively to the input 110 and the output 112 of the inverter 104. In operation, when the circuit supply voltage Vcc is turned on, the transistor 114 will be on, generating a voltage Vout at the inverter output 112. Vout then charges up the capacitor 108 and develops a voltage at the crystal element 102, causing it to begin oscillating at a low amplitude. This generates a voltage Vin at the input 110 of the inverter and charges capacitor 106. The increasing voltage Vin slowly causes the inverter 104 to move to its high gain region, thereby allowing the amplitude of the oscillations of the crystal element 102 to increase. The noise generator 116 can be configured to generate a certain amount of noises and inject the noises into the oscillation of the crystal element 102 during the startup.

Figure 2A:
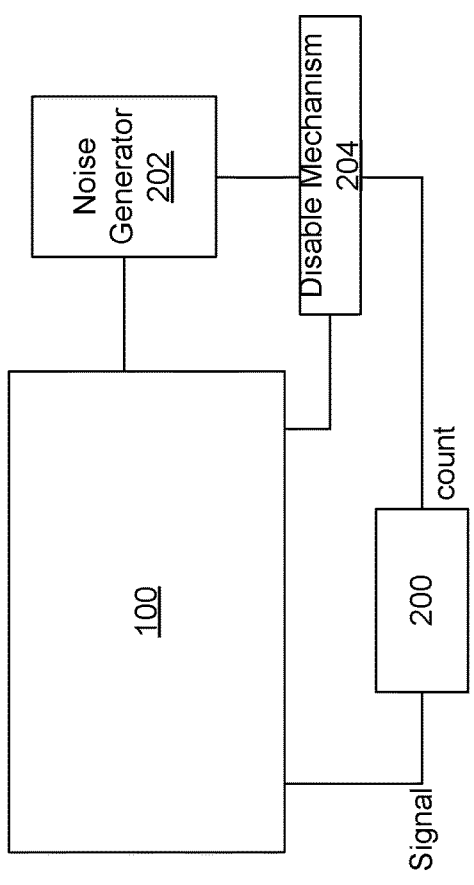
FIG. 2A illustrates a learning block that can be connected to the example oscillator circuit shown in FIG. 1.

FIG. 2A illustrates a learning block 200 can be connected to the oscillator circuit 100. The learning block 200 can be used to count a number of clock cycles for the crystal element 102 to stabilize during a given startup. This count can then be used to control noise injection for the crystal element 102 during a next startup after the given startup. One insight provided by the inventor(s) is that every crystal element 102 can have a unique set of physical characteristics such as capacitance, aging, temperature and etc. These characteristics may affect the startup time for the crystal element 102. That is, different crystal element 102 can have different startup time to stabilize. Traditionally, noise injection for the crystal element 102 during the startup time is controlled according to a worse case among a number of crystal elements. For example, a manufacturer may measure startup time for different crystal oscillators manufactured by the manufacturer in a lab. The noise injection to the oscillator circuit 100 is then controlled according to the longest measured startup time for those crystal oscillators. Although, in some cases, startup time variations among different crystal oscillators may not be very significant, this can still lead to inefficiency since some crystal oscillators do not take the longest measured startup time to stabilize.

As an improvement, the learning block 200 can be placed in parallel to the oscillator circuit 100 for controlling the noise injection by the noise generator 202 on a per-chip basis. As shown, the learning block 200 can be configured to receive a signal from the oscillator circuit 100 as an input. The received signal can include information indicating a level of oscillation the crystal element 102 is currently having. Based on such a signal, the learning block 200 can determine whether the crystal element 102 has reached a predetermined oscillation level (e.g., stabilized). For example, when the received signal indicates that crystal element is just being started, the learning block 200 may be configured to reset the count to 0, and to start incrementing an internal counter. When the received signal indicates that the oscillation level of the crystal element 102 has reached the predetermined oscillation level, the learning block 200 can be configured to stop the counter and to store the counted number of clock cycles for this startup in a buffer. This count can be used by the oscillation circuit 100 to control the noise injection for the next startup(s) of the crystal element 102.

Figure 2B:
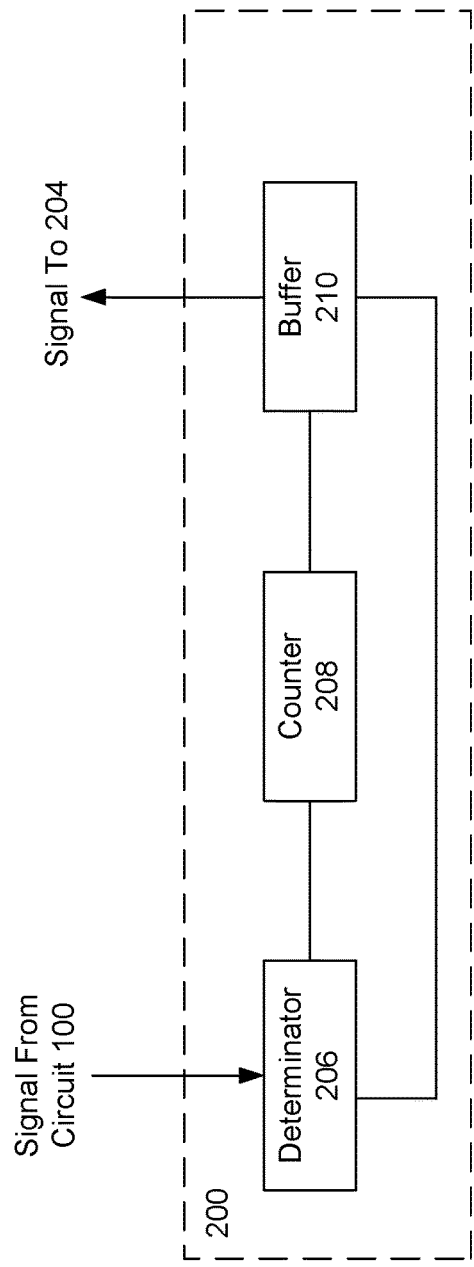
FIG. 2B illustrates one example of a learning block shown in FIG. 2A.

FIG. 2B illustrates one example of a learning block 200 in accordance with the disclosure. As shown, the learning block 200 can comprise a determinator 206, a counter 208, a buffer 210, and/or any other components. The determinator 204 can be configured to receive a signal from the oscillator circuit 100. As mentioned above, this signal can indicate a current oscillation level of the crystal element 102. The determinator 206 can be configured to read a predetermined oscillation level for the crystal element 102, for example from the buffer 210. The determinator 206 can be configured to compare the current oscillation level of the crystal element 102 and the predetermined oscillation level to determine whether crystal element 102 has reached the predetermined oscillation level. The determinator 206 can be configured to generate an instruction to have the counter 208 to reset a count to 0 and start incrementing the count (in clock cycles) when the received signal indicates the current oscillation level of the crystal element 102 is 0 or slightly above 0. The determinator 206 can be configured to generate an instruction to have the count stop counting the clock cycles when it is determined that crystal element 102 has reached the predetermined oscillation level.

The counter 208 can be configured to start and stop counting clock cycle by clock cycle based on the above-described instructions from the determinator 206. Once stopped, the counter 208 can be configured to store the counted number of clock cycles in the buffer 210. As shown, the buffer 210 can be connected to a disable mechanism 204, which in some examples may comprise a tristate buffer. The disable mechanism 204 can be configured to control the deactivation of the noise injection by the noise generator 202. For example, as illustration, if the count is 200 clock cycles as determined by the determinator 206, the disable mechanism 204 can be configured to read this count and deactivate the noise injection by the noise generator 202 after the 200 clock cycles have reached during the current startup of the crystal element 102.

In some implementations, the determinator 206 can be configured to account for a lead time that may be needed for disabling noise injection by the disable mechanism 204. For example, as illustration, the determinator 206 may determine that it takes 150 clock cycles for the crystal element 102 to stabilize during the current startup for the crystal element 102. The determinator 206 may be configured with a lead time factor (e.g., 5 clock cycles) such that the counted number of clock cycles for the crystal element 102 to stabilize is reduced based on the lead time factor (e.g., 150−5=145 clock cycles) when stored in the buffer 210. In this way, when the disable mechanism 204 reads the count stored in the buffer 210, the stored count is already adjusted according to the lead time factor.

In some implementations, an adjustment block 300 may be employed to adjust the count read from the buffer 210 by the disable mechanism 204. As mentioned above, the count stored in the buffer 210 can indicate a counted number of clock cycles for crystal element 102 to stabilize during a previous startup from the disable mechanism 204's point of view. This count is then used by the disable mechanism 204 to control the deactivation of the noise injection during the current startup of the crystal element 102. In those implementations, the adjustment block 300 can be used to adjust (e.g., fine-tune) the count based on certain factor(s) such as temperature, aging, etc., that may affect the duration for the crystal element 102 to stabilize between different startups.

Figure 3A:
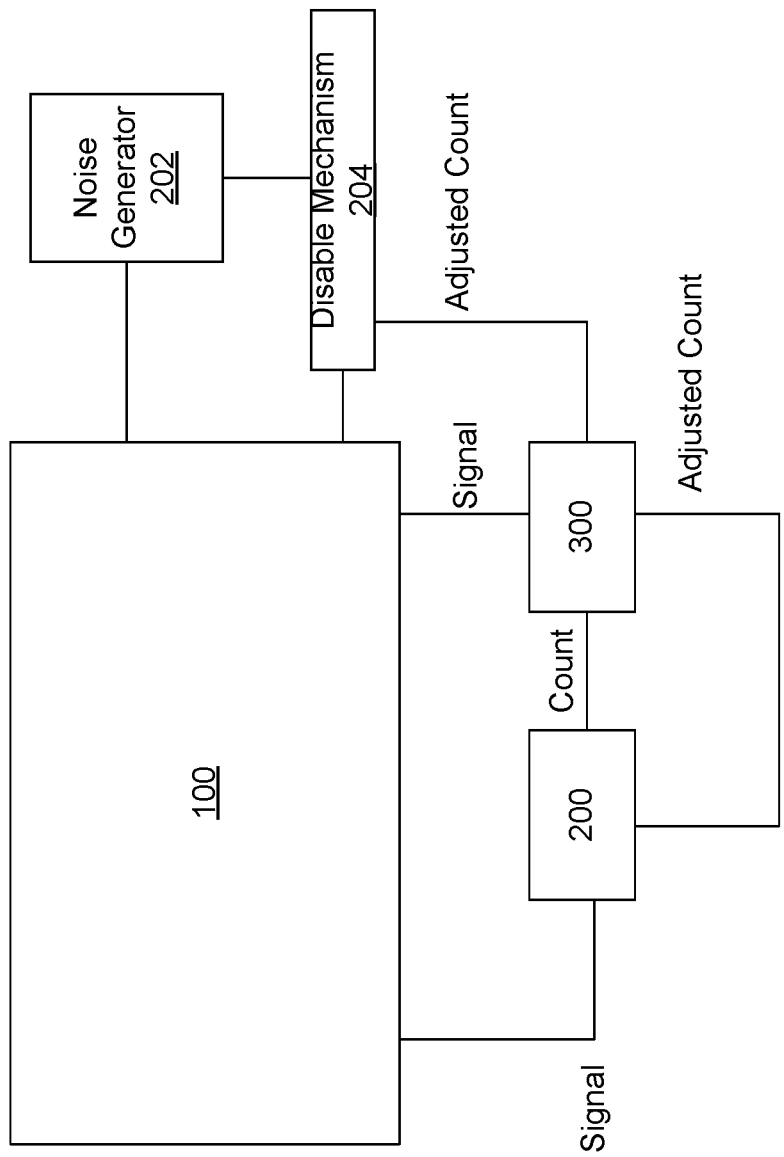
FIG. 3A illustrates an adjustment block that can be connected with the oscillation circuit shown in FIG. 1 and the learning block shown in FIG. 2A.

FIG. 3A illustrates one example of an adjustment block 300 that can be connected with the oscillation circuit 100 and the learning block 200. The adjustment block 300 can be configured to read the count from learning block 200. The adjustment block 300 can be configured to receive a signal from the oscillation circuit 100, such as a signal indicating a temperature of the crystal element 102. The adjustment block 300 can be configured to determine an adjustment for the count based on the signal received from the oscillation circuit 100 and to obtain an adjusted count. The adjusted count can be stored in the buffer 210 of the learning block 200 for use in a next startup. The adjusted count can be sent to the disable mechanism 204 for control the deactivation of the noise injection for the current startup.

Figure 3B:
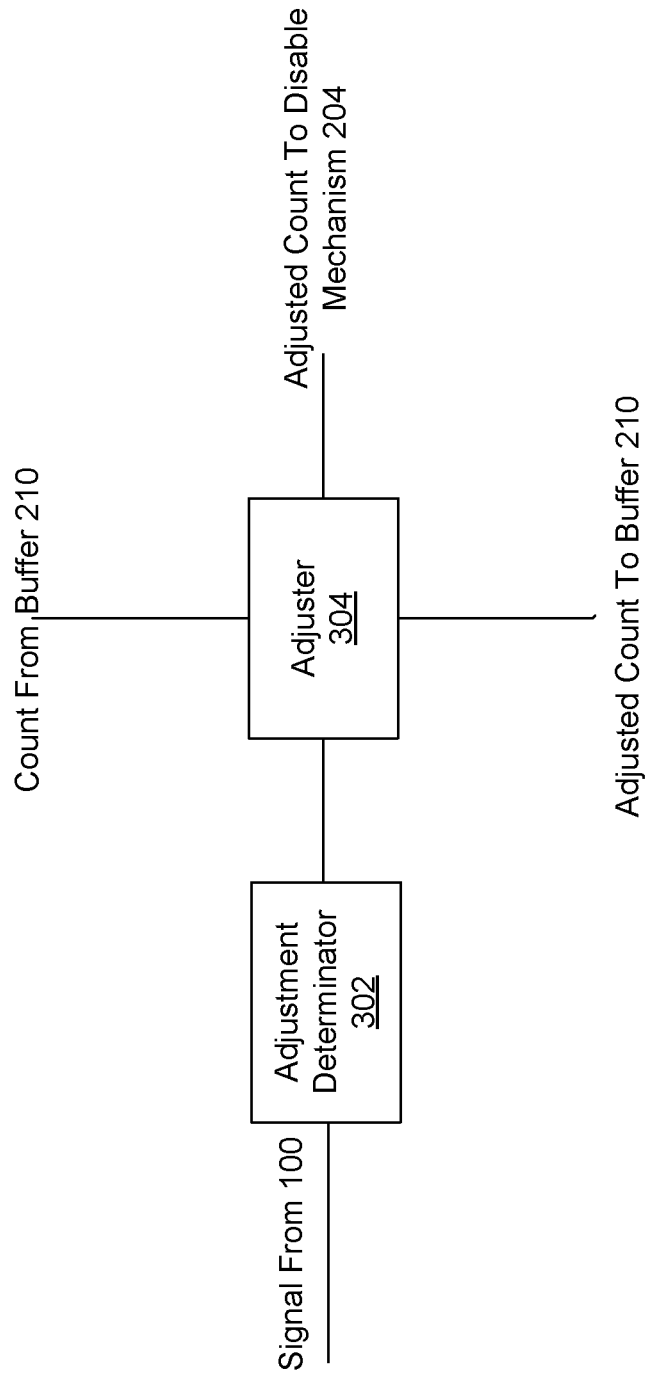
FIG. 3B illustrates one example of the adjustment block shown in FIG. 3A.

FIG. 3B illustrates one example of adjustment block 300 in accordance with the disclosure. As shown, the adjustment block 300 can comprise an adjustment determinator 302, an adjuster 304, and/or any other components. The adjustment determinator 302 can be configured to receive a signal from the learning block 200. The signal can indicate a characteristic about the crystal element 102 such as its temperature at the current startup. The adjustment determinator 302 can be configured to determine an adjustment for the clock cycles to stabilize the crystal element 102. For example, the adjustment determinator 302 can be configured to determine a 5 clock cycle adjustment is needed for the current startup based on a temperature of the crystal element 102 measured during the current startup. This adjustment can account for factors that may affect the stabilizing duration for the crystal element 102 during the current startup. In some implementations, the adjustment determinator 302 can be configured to store historical characteristics of the crystal element 102, such as its temperature over time. In those implementations, the adjustment determinator 302 can compare the stored historical characteristics and determine the adjustment to the count based on the comparison.

The adjuster 304 can be configured to read the count stored in the buffer 210 and adjust the count based on the adjustment determined by the adjustment determinator 302. For example, as illustration, the adjustment determinator 302 may determine the adjustment for the count is –5 clock cycles based on the measured temperature of the crystal element 102; and the count is 120 clock cycles. In that case, the adjustment determinator 302 may adjust the count to 115 clock cycles. As also shown, the adjusted count can be fetched to the disable mechanism 204 for controlling the deactivation of the noise injection. The adjusted count can also be stored in the buffer 210 for next use in some implementations.

Figure 4:
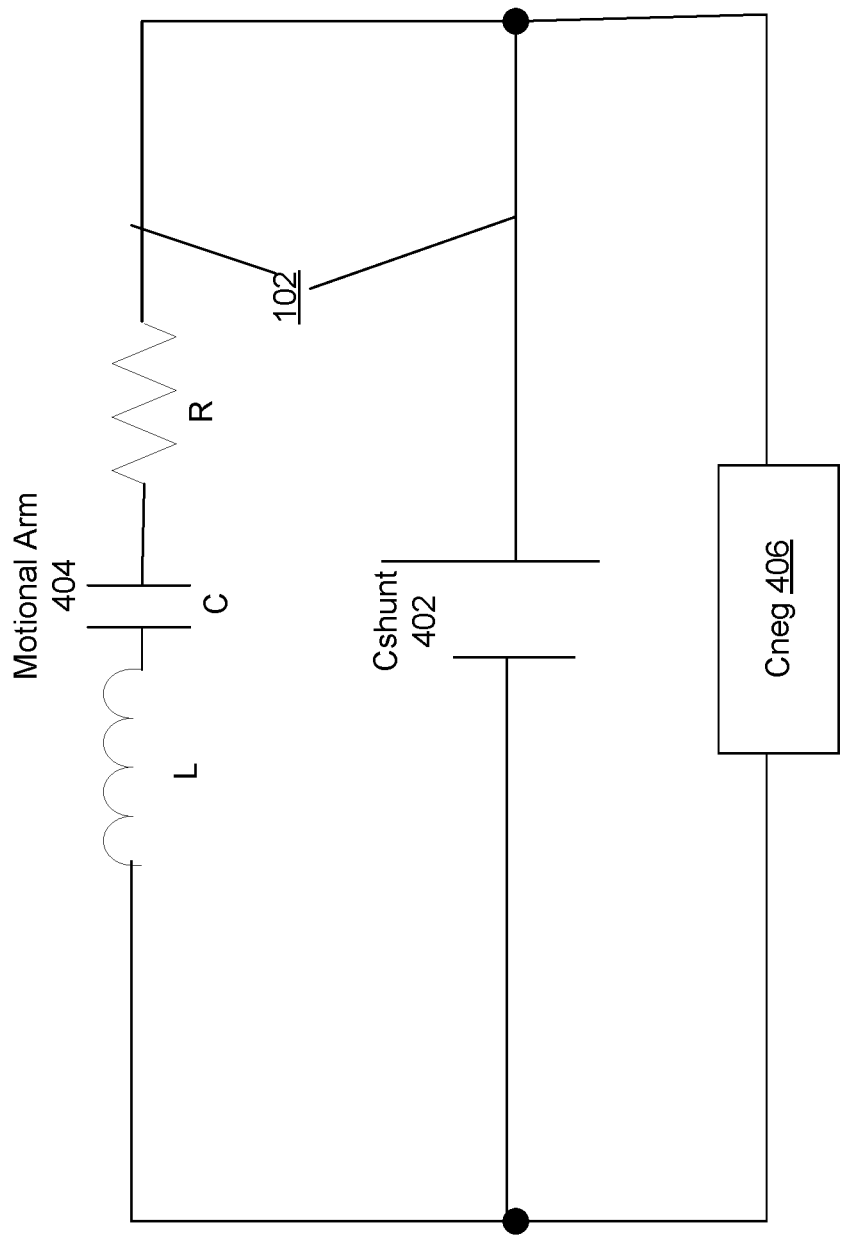
FIG. 4 illustrates an example of a circuit that can generate negative resistance and/or negative impedance to cancel Cshunt capacitance and/or impedence for the oscillator circuit shown in FIG. 1.

FIG. 4 illustrates a simple block 400 showing the crystal element 102 may be connected in parallel to a Cneg circuit 406 in some embodiments. As shown, the crystal element 102 can be modeled as Cshunt 402 and motional arm 404. Cshunt capacitance is the passive resistance that can affect the startup time of the crystal element 102; and is a main factor for reducing the negative resistance from the oscillator core. The Cneg circuit 406 can be configured to generate a negative capacitance to cancel the Cshunt capacitance of the crystal element 102. In those implementations, the negative capacitance generated by the Cneg circuit 406 may be a float negative resistance around 4 pF. In some embodiments, the Cneg circuit 402 may be only used during the startup time for the crystal oscillator such that the Cneg circuit 402 is disconnected once the crystal oscillator stabilizes to avoid frequency shifting. In some implementations, the Cneg circuit 402 can be configured to generate negative impedance comprising a combination of negative resistance and capacitance to cancel the impedance of the crystal element 102.

Figure 5:
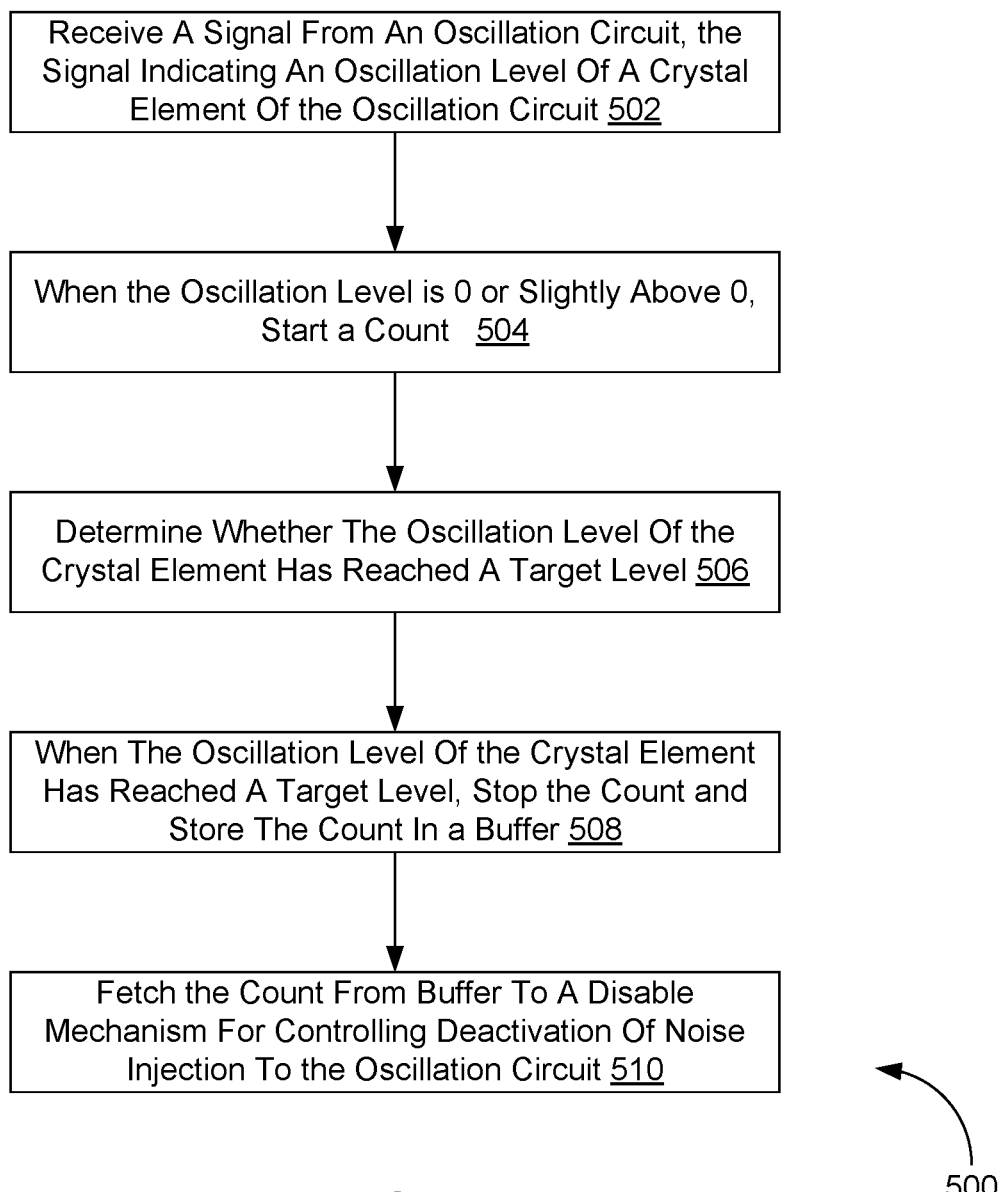
FIG. 5 illustrates an exemplary method for controlling a startup for an oscillator circuit in accordance with the disclosure.

Attention is now is directed to FIG. 5 where an exemplary method 500 for controlling a startup for an oscillator circuit in accordance with the disclosure. The particular series of processing steps depicted in FIG. 5 is not intended to be limiting. It is appreciated that the processing steps may be performed in an order different from that depicted in FIG. 5 and that not all the steps depicted in FIG. 5 need be performed. In certain implementations, the method 500 may be implemented by a video processing center, such as the video processing center shown in FIG. 5.

In some embodiments, the method depicted in method 500 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 500 in response to instructions stored electronically on an electronic storage medium. The one or more processing devices may include one or more devices configured through hardware, firmware, and/or software to be specifically designed for execution of one or more of the operations of method 500.

At 502, a signal can be received from an oscillation circuit. The signal can indicate an oscillation level of a crystal element of the oscillation circuit. In some implementations, operations involved in 502 can be implemented by a learning block the same as or substantially similar to the learning block 200 described and illustrated herein.

At 504, it can be determined from the signal received at 502 whether a current oscillation level of the crystal element is 0 or slightly above 0. When it is determined that the current oscillation level of the crystal element is 0 or slightly above 0, a count can be started. In some implementations, operations involved in 504 can be implemented by a learning block the same as or substantially similar to the learning block 200 described and illustrated herein.

At 506, it can be determined from the signal received at 502 whether the current oscillation level of the crystal element determined at 504 has reached a target oscillation level. When it is determined that the current oscillation level of the crystal element has reached the target oscillation level, the count can be stopped and the value of the count can be stored in a bu. In some implementations, operations involved in 506 can be implemented by a learning block the same as or substantially similar to the learning block 200 described and illustrated herein.

At 506, the count stored in the buffer can be fetched to a disable mechanism for controlling deactivation of noise injection to the oscillation circuit. In some implementations, operations involved in 504 can be implemented by a learning block the same as or substantially similar to the learning block 200 described and illustrated herein.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are illustrated in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A circuit configured for controlling a startup for an oscillator circuit, the circuit comprising:
   a learning block configured to:
      obtain an oscillation level of a crystal element in the oscillator circuit during a startup of the crystal element;
      when the oscillation level is at a predetermined threshold or slightly above the predetermined threshold:
         reset a count of the learning block to the predetermined threshold; and
         start incrementing the count by clock cycles; and
      when the oscillation level the crystal element has reached a predetermined target oscillation level, stop the count; and, wherein
   the learning block is configured for deactivating negative capacitance generation for the oscillator circuit, wherein the count is accessible for controlling the deactivation of the negative capacitance generation.

2. The circuit of claim 1, wherein the learning block is further configured to adjust the count to account for a lead time for deactivate noise injection by a disable mechanism.

3. The circuit of claim 2, wherein the disable mechanism comprises a tristate buffer.

4. The circuit of claim 1, wherein the count indicates a time duration in a first startup for the crystal element to stabilize and the count is used to control the deactivation of negative capacitance generation during a second startup for the crystal element, the second startup being after the first startup.

5. The circuit of claim 1, wherein the learning block comprises:
   a determinator configured to determine whether the oscillation level of the crystal element has reached the predetermined target oscillation level; and
   a counter configured to increment the count when the oscillation level of the crystal element has not reached the predetermined target oscillation level, and to stop the count when the oscillation level of a crystal element has reached the predetermined target oscillation level.

6. The circuit of claim 1, further comprising an adjustment block operatively connected to the learning block, the adjustment block being configured to:
   receive one or more values indicating one or more measured characteristics of the oscillator circuit during a current startup of the oscillator circuit;
   obtain the count from the learning block;
   adjust the count based on the one or more values indicating the one or more measured characteristics of the oscillator circuit; and
   store the adjusted count in a buffer.

7. The circuit of claim 6, wherein the one or more characteristics of the oscillator circuit includes a temperature of the crystal element.

8. The circuit of claim 6, wherein the adjustment block is further configured to fetch the adjusted count in the buffer to the disable mechanism in the current startup for the crystal element.

9. The circuit of claim 1, further comprising a negative impedance block operatively connected to the oscillation circuit, and configured to generate the negative capacitance to cancel impedance of the crystal element.

10. The circuit of claim 9, wherein the negative capacitance generated by the impedance block includes a combination of negative resistance and capacitance.

11. The circuit of claim 9, wherein the negative capacitance generated by the impedance block includes a float negative resistance around 4 pF.

12. A method for controlling deactivation of noise injection during a startup for an oscillator circuit, the method being implemented by a circuit comprising a learning block, the circuit being operatively connected to the oscillator circuit, the method comprising:

obtaining an oscillation level of a crystal element in the oscillator circuit during a startup of the crystal element;

when the oscillation level is at a predetermined threshold or slightly above the predetermined threshold:
resetting a count of the learning block to the predetermined threshold; and
starting incrementing the count by clock cycles; and when the oscillation level the crystal element has reached the predetermined target oscillation level, stopping the count; and, wherein the learning block is configured for deactivating negative capacitance generation for the oscillator circuit, wherein the count is accessible for controlling the deactivation of the negative capacitance generation.

13. The method of claim 12, wherein the method further comprises adjusting the count to account for a lead time for deactivate noise injection by a disable mechanism.

14. The method of claim 13, wherein the count indicates a time duration in a first startup for the crystal element to stabilize and the count is used by the disable mechanism to control the deactivation of the noise injection during a second startup for the crystal element, the second startup being after the first startup.

15. The method of claim 12, wherein the circuit further comprises an adjustment block operatively connected to the learning block, the method being further implemented by the adjustment block, the method further comprising:

receiving one or more values indicating one or more measured characteristics of the oscillator circuit during a current startup of the oscillator circuit;
obtaining the count from the learning block;
adjusting the count based on the one or more values indicating the one or more measured characteristics of the oscillator circuit; and
storing the adjusted count in a buffer.

16. The method of claim 15, wherein the one or more characteristics of the oscillator circuit includes a temperature of the crystal element.

17. The method of claim 16, wherein the method further comprises fetching the adjusted count in the buffer to the disable mechanism in the current startup for the crystal element.

18. The method of claim 12, wherein the method further comprises a negative impedance block operatively connected to the oscillation circuit, and the method further being further implemented by the negative impedance block, the method further comprising generating the negative capacitance to cancel impedance of the crystal element.

19. The method of claim 18, wherein the negative impedance generated by the impedance block includes a combination of negative resistance and capacitance.

20. The method of claim 19, wherein the negative capacitance generated by the impedance block includes a float negative resistance around 4 pF.

* * * * *